United States Patent
Best

(10) Patent No.: US 9,504,190 B2
(45) Date of Patent: Nov. 22, 2016

(54) SYSTEM AND METHOD OF PACKAGING COMPUTING RESOURCES FOR SPACE AND FIRE-RESISTANCE

(71) Applicant: Green Revolution Cooling, Inc., Austin, TX (US)

(72) Inventor: Christiaan Scott Best, Austin, TX (US)

(*) Notice: Subject to any disclaimer, the term of this patent is extended or adjusted under 35 U.S.C. 154(b) by 72 days.

(21) Appl. No.: 14/271,386

(22) Filed: May 6, 2014

(65) Prior Publication Data
US 2014/0362527 A1    Dec. 11, 2014

Related U.S. Application Data

(60) Provisional application No. 61/854,949, filed on May 6, 2013.

(51) Int. Cl.
| | | |
|---|---|---|
| *H05K 7/20* | (2006.01) | |
| *G06F 1/20* | (2006.01) | |
| *H01L 23/473* | (2006.01) | |

(52) U.S. Cl.
CPC .............. *H05K 7/2079* (2013.01); *G06F 1/20* (2013.01); *G06F 2200/201* (2013.01)

(58) Field of Classification Search
CPC .............................. G06F 1/181–1/182; H05K 7/20218–7/20381; H05K 7/20409–7/20418; H05K 7/20009–7/202; H01L 23/46–23/3677
USPC ........................ 361/676–678, 679.46–679.54, 361/688–723; 165/80.1–80.5, 104.33, 185; 174/15.1–15.3, 16.1–16.3, 547, 548;
(Continued)

(56) References Cited

U.S. PATENT DOCUMENTS

| | | |
|---|---|---|
| 3,600,636 A | 8/1971 | Petersen |
| 3,858,090 A | 12/1974 | Lehmann |
| 4,245,668 A | 1/1981 | Lindstrom |
| (Continued) | | |

FOREIGN PATENT DOCUMENTS

| | | |
|---|---|---|
| CN | 101443724 A | 5/2009 |
| JP | 2004319628 | 11/2004 |
| (Continued) | | |

OTHER PUBLICATIONS

Non-Final Office Action in U.S. Appl. No. 14/667,091, mailed May 22, 2015, 16 pages.
(Continued)

*Primary Examiner* — Anthony Haughton
*Assistant Examiner* — Razmeen Gafur
(74) *Attorney, Agent, or Firm* — The Marbury Law Group, PLLC

(57) ABSTRACT

A computing system includes one or more rack rows comprising one or more racks. The racks includes one or more tanks that hold liquid coolant for at least one of the one or more servers, and a liquid coolant to remove heat from at least one of the one or more servers. An aisle is provided next to a rack row or between two of the rack rows. The aisle includes a floor. The floor can be walked on by service personnel to access at least one of the one or more racks in at least one of the rows. Cooling components at least partially below the aisle move a liquid to remove heat from at least one of the servers in at least one of the racks. The racks, floor and cooling components may be fire-resistant.

18 Claims, 8 Drawing Sheets

(58) Field of Classification Search
USPC .................... 257/712–722, E23.088; 24/453, 24/458–459; 454/184; 312/236
See application file for complete search history.

(56) References Cited

U.S. PATENT DOCUMENTS

| | | | |
|---|---|---|---|
| 4,302,793 A | 11/1981 | Rohner | |
| 4,399,501 A | 8/1983 | Masselin | |
| 4,590,538 A | 5/1986 | Cray, Jr. | |
| 4,834,257 A | 5/1989 | Book et al. | |
| 5,260,850 A | 11/1993 | Sherwood et al. | |
| 5,297,621 A | 3/1994 | Taraci et al. | |
| 5,329,418 A | 7/1994 | Tanabe | |
| 5,574,627 A | 11/1996 | Porter | |
| 6,019,167 A | 2/2000 | Bishop et al. | |
| 6,374,627 B1 | 4/2002 | Schumacher et al. | |
| 6,600,656 B1 | 7/2003 | Mori et al. | |
| 6,621,707 B2 | 9/2003 | Ishimine et al. | |
| 6,909,606 B2 | 6/2005 | Barsun et al. | |
| 7,086,247 B2 | 8/2006 | Campbell et al. | |
| 7,184,269 B2 | 2/2007 | Campbell et al. | |
| 7,210,304 B2 | 5/2007 | Nagashima et al. | |
| 7,278,273 B1 | 10/2007 | Whitted et al. | |
| 7,307,841 B2 | 12/2007 | Berlin et al. | |
| 7,318,322 B2 | 1/2008 | Ota et al. | |
| 7,403,392 B2 | 7/2008 | Attlesey et al. | |
| 7,413,394 B2 | 8/2008 | Risser | |
| 7,609,518 B2 | 10/2009 | Hopton et al. | |
| 7,686,175 B2 | 3/2010 | Waisanen | |
| 7,724,517 B2 | 5/2010 | Attlesey et al. | |
| 7,757,506 B2 | 7/2010 | Ellsworth, Jr. et al. | |
| 7,843,298 B2 | 11/2010 | Hosokawa et al. | |
| 7,905,106 B2 | 3/2011 | Attlesey | |
| 7,911,782 B2 | 3/2011 | Attlesey et al. | |
| 7,911,793 B2 | 3/2011 | Attlesey | |
| 7,934,386 B2 | 5/2011 | Rummel et al. | |
| 7,971,632 B2 | 7/2011 | Eriksen | |
| 8,009,419 B2 | 8/2011 | Attlesey et al. | |
| 8,310,829 B2 | 11/2012 | Monk et al. | |
| 8,437,129 B2 * | 5/2013 | Tung .................. | H05K 7/20772 165/80.4 |
| 8,582,292 B1 * | 11/2013 | Eichelberg ......... | H05K 7/20736 361/679.49 |
| 8,730,671 B2 * | 5/2014 | VanDerVeen ...... | H05K 7/20736 165/104.33 |
| 8,817,465 B2 | 8/2014 | Campbell et al. | |
| 9,049,800 B2 | 6/2015 | Shelnutt et al. | |
| 2002/0151799 A1 | 10/2002 | Pantages et al. | |
| 2002/0185262 A1 | 12/2002 | Baer | |
| 2003/0053293 A1 | 3/2003 | Beitelmal et al. | |
| 2003/0127240 A1 | 7/2003 | Beckbissinger et al. | |
| 2004/0008490 A1 | 1/2004 | Cheon | |
| 2004/0050491 A1 | 3/2004 | Miya et al. | |
| 2004/0223300 A1 * | 11/2004 | Fink .................... | H05K 7/20 361/690 |
| 2004/0246683 A1 | 12/2004 | Honsberg-Riedl et al. | |
| 2005/0024826 A1 * | 2/2005 | Bash ................... | G06F 1/20 361/695 |
| 2005/0052847 A1 | 3/2005 | Hamman | |
| 2005/0083657 A1 | 4/2005 | Hamman | |
| 2005/0111184 A1 * | 5/2005 | Cliff ................... | G06F 1/206 361/688 |
| 2005/0114876 A1 | 5/2005 | Atarashi et al. | |
| 2005/0152112 A1 | 7/2005 | Holmes et al. | |
| 2005/0259402 A1 | 11/2005 | Yasui et al. | |
| 2006/0026610 A1 | 2/2006 | Sasao et al. | |
| 2006/0064709 A1 | 3/2006 | Throckmorton et al. | |
| 2006/0123436 A1 | 6/2006 | Tanaka et al. | |
| 2006/0135042 A1 | 6/2006 | Frost et al. | |
| 2006/0250755 A1 | 11/2006 | Tilton et al. | |
| 2006/0274501 A1 | 12/2006 | Miller | |
| 2007/0006599 A1 | 1/2007 | Kawamura et al. | |
| 2007/0025081 A1 | 2/2007 | Berlin et al. | |
| 2007/0034360 A1 | 2/2007 | Hall | |
| 2007/0199340 A1 | 8/2007 | Knight et al. | |
| 2007/0213000 A1 | 9/2007 | Day | |
| 2007/0227710 A1 | 10/2007 | Belady et al. | |
| 2007/0267741 A1 | 11/2007 | Attlesey et al. | |
| 2008/0002364 A1 | 1/2008 | Campbell et al. | |
| 2008/0017355 A1 | 1/2008 | Attlesey et al. | |
| 2008/0026509 A1 | 1/2008 | Campbell et al. | |
| 2008/0030945 A1 | 2/2008 | Mojaver et al. | |
| 2008/0055845 A1 | 3/2008 | Murakami et al. | |
| 2008/0158818 A1 | 7/2008 | Clidaras et al. | |
| 2008/0174954 A1 * | 7/2008 | VanGilder .......... | H05K 7/20836 361/679.54 |
| 2008/0180908 A1 * | 7/2008 | Wexler ............... | H05K 7/20745 361/690 |
| 2008/0196868 A1 | 8/2008 | Attlesey et al. | |
| 2008/0196870 A1 | 8/2008 | Attlesey et al. | |
| 2008/0209931 A1 | 9/2008 | Stevens | |
| 2008/0273306 A1 * | 11/2008 | Campbell ........... | H05K 7/20745 361/698 |
| 2009/0168345 A1 * | 7/2009 | Martini ................ | F24F 11/0001 361/691 |
| 2009/0229194 A1 | 9/2009 | Armillas | |
| 2009/0251860 A1 * | 10/2009 | Belady ............... | H05K 7/20745 361/690 |
| 2009/0260777 A1 | 10/2009 | Attlesey | |
| 2009/0262455 A1 | 10/2009 | Merrow | |
| 2010/0027212 A1 * | 2/2010 | Daunert Armillas ..... | G06F 1/20 361/679.33 |
| 2010/0061057 A1 * | 3/2010 | Dersch ............... | H05K 7/20745 361/690 |
| 2010/0103618 A1 | 4/2010 | Campbell et al. | |
| 2010/0165565 A1 * | 7/2010 | Hellriegal ............ | G06F 1/183 361/679.46 |
| 2010/0226094 A1 | 9/2010 | Attlesey et al. | |
| 2010/0246118 A1 * | 9/2010 | Attlesey .............. | G06F 1/20 361/679.53 |
| 2010/0263885 A1 | 10/2010 | Tuma | |
| 2010/0275441 A1 | 11/2010 | Rasmussen et al. | |
| 2010/0290190 A1 * | 11/2010 | Chester ............... | H05K 7/20772 361/701 |
| 2010/0302678 A1 | 12/2010 | Merrow | |
| 2010/0315775 A1 * | 12/2010 | Grantham ........... | H05K 7/20745 361/688 |
| 2011/0026225 A1 * | 2/2011 | Ostwald ............. | H05K 7/20645 361/699 |
| 2011/0063792 A1 * | 3/2011 | Schmidt .............. | G06F 1/20 361/679.46 |
| 2011/0075353 A1 | 3/2011 | Attlesey et al. | |
| 2011/0122570 A1 * | 5/2011 | Beck ................... | H05K 7/20745 361/679.46 |
| 2011/0132579 A1 | 6/2011 | Best et al. | |
| 2011/0134604 A1 | 6/2011 | Attlesey | |
| 2011/0240281 A1 | 10/2011 | Avery | |
| 2011/0267775 A1 * | 11/2011 | VanDerVeen ...... | H05K 7/20736 361/692 |
| 2012/0026691 A1 * | 2/2012 | Campbell ........... | H05K 7/20781 361/700 |
| 2012/0035773 A1 | 2/2012 | Stabinski et al. | |
| 2012/0123595 A1 | 5/2012 | Bower, III et al. | |
| 2012/0155027 A1 * | 6/2012 | Broome ............... | H05K 7/1497 361/696 |
| 2012/0236487 A1 * | 9/2012 | Wallace ............. | H05K 7/20727 361/679.31 |
| 2012/0300391 A1 * | 11/2012 | Keisling ............ | H05K 7/20745 361/679.46 |
| 2013/0025888 A1 | 1/2013 | Eckholm et al. | |
| 2013/0032217 A1 | 2/2013 | Pesek et al. | |
| 2013/0105139 A1 | 5/2013 | Campbell et al. | |
| 2013/0146273 A1 | 6/2013 | Chester et al. | |
| 2014/0085817 A1 | 3/2014 | Campbell et al. | |
| 2014/0085821 A1 | 3/2014 | Regimbal et al. | |
| 2014/0109610 A1 | 4/2014 | Wulf et al. | |
| 2014/0211412 A1 | 7/2014 | Best | |
| 2014/0216686 A1 | 8/2014 | Shelnutt et al. | |
| 2014/0218858 A1 | 8/2014 | Shelnutt et al. | |
| 2014/0301037 A1 | 10/2014 | Best | |

(56) References Cited

U.S. PATENT DOCUMENTS

2014/0307384 A1  10/2014  Best
2015/0334880 A1  11/2015  Best

FOREIGN PATENT DOCUMENTS

| | | |
|---|---|---|
| JP | 2004363308 | 12/2004 |
| WO | 2007023130 A2 | 3/2007 |
| WO | 2007098078 A2 | 8/2007 |
| WO | 2008027931 A2 | 3/2008 |
| WO | 2008089322 A2 | 7/2008 |
| WO | 2010019517 A1 | 2/2010 |
| WO | 2013022805 A1 | 2/2013 |

OTHER PUBLICATIONS

Substantive Examination Adverse Report, Malaysian Application No. PI2011000494, mailed May 15, 2015, 3 pages.
Australian Government IP Australia, Patent Examination Report No. I for Application No. 2009282170, Nov. 18, 2013, 4 pages, Australia.
Patent Examination Report No. 2 from Australian Application No. 2009282170, issued Jun. 18, 2014, pp. 1-4.
U.S. International Searching Authority, International Search Report & Written Opinion for PCT/US2012/049668, Oct. 19, 2012, Alexandria, VA, US.
Office Action from Chinese Application No. 200980131707.3, issued Dec. 31, 2014, English and Chinese versions, pp. 1-10.
Office Action from Chinese Application No. 200980131707.3, issued Apr. 3, 2014, English translation, pp. 1-4.
The State Intellectual Property Office of the People's Republic of China, Notice on the First Office Action for Application No. 200980131707.3, Dec. 20, 2012, China.
The State Intellectual Property Office of the People's Republic of China, Notice on the second Office Action for Application No. 200980131707.3, Jul. 31, 2013, China.
Office Action from Chinese Application No. 200980131707.3, issued Apr. 18, 2014, English and Chinese versions, pp. 1-7.
Office Action from Chinese Application No. 200980131707.3, issued Jul. 31, 2013, English translation, pp. 1-8.
U.S. Appl. No. 14/338,035, filed Jul. 22, 2014, Christiaan Scott Best, 60 pages.
U.S. Appl. No. 14/338,013, filed Jul. 22, 2014, Christiaan Scott Best, 60 pages.
U.S. Appl. No. 14/338,020, filed Jul. 22, 2014, Christiaan Scott Best, 60 pages.
U.S. Appl. No. 14/338,026, filed Jul. 22, 2014, Christiaan Scott Best, 60 pages.
U.S. Appl. No. 14/667,091, filed Mar. 24, 2015, Christiaan Scott Best, 65 pages.
U.S. International Searching Authority, International Search Report and Written Opinion for PCT/US2009/053305, Oct. 14, 2009, Alexandria, VA, US, 2 pages.
Final Office Action, U.S. Appl. No. 13/057,881, 25 pages, mailed Jun. 16, 2015, 30 pages.
Office Action from U.S. Appl. No. 13/057,881, issued Mar. 3, 2015, 20 pages.
Office Action from U.S. Appl. No. 13/057,881, issued Jan. 9, 2015, 3 pages.
Final Office Action from U.S. Appl. No. 13/057,881, issued Nov. 3, 2014, 23 pages.
Applicant-Initialed Interview Summary from U.S. Appl. No. 13/057,881, issued Oct. 9, 2014, 3 pages.
Applicant-Initialed Interview Summary from U.S. Appl. No. 13/057,881, issued Jul. 1, 2014, 3 pages.
Office Action from U.S. Appl. No. 13/057,881, issued Apr. 11, 2014, 16 pages.
Applicant-Initialed Interview Summary from U.S. Appl. No. 13/057,881, issued Feb. 25, 2014, 4 pages.
Final Office Action from U.S. Appl. No. 13/057,881, issued Nov. 22, 2013, 13 pages.
Office Action from U.S. Appl. No. 13/057,881, issued Jun. 4, 2013, 9 pages.
U.S. Appl. No. 13/057,881, filed Feb. 7, 2011, Christiaan Scott Best, 72 pages.
Supplemental Search Report, European Application No. 12821634.8, mailed Jul. 15, 2015, 6 pages.
Intellectual Property Office of Singapore, Written Opinion and Search Report for Application No. 201100595-6, Apr. 16, 2012, 20 pages, Singapore.
International Search Report & Written Opinion, Application No. PCT/US15/30618, mailed Aug. 5, 2015, 12 pages.
International Search Report & Written Opinion, Application No. PCT/US14/33081, mailed Aug. 27, 2014, 9 pages.
International Search Report & Written Opinion, Application No. PCT/US14/33834, mailed Sep. 15, 2014, 16 pages.
International Search Report & Written Opinion, Application No. PCT/US2014/037005, mailed Sep. 24, 2014, 18 pages.
International Search Report & Written Opinion, Application No. PCT/US14/17835, mailed Jun. 13, 2014, 9 pages.
Notice of Acceptance, Australian Application No. 2009282170, mailed Nov. 14, 2014, 2 pages.
International Search Report & Written Opinion, Application No. PCT/US15/43468, mailed Oct. 30, 2015, 11 pages.
Office Action, Canadian Application No. 2,731,994, mailed Dec. 3, 2015, 6 pages.
International Preliminary Report on Patentability, Application No. PCT/US2014/033081, mailed Aug. 27, 2014, 9 pages.
International Preliminary Report on Patentability, Application No. PCT/US2014/037005, mailed Sep. 24, 2014, 18 pages.
Office Action, Chinese Application No. 201280049039.1, mailed Oct. 27, 2015, 33 pages.
Non-final Office Action, U.S. Appl. No. 14/245,978, mailed Jan. 13, 2016, 33 pages.
Non-final Office Action, U.S. Appl. No. 14/251,014, mailed Dec. 4, 2015, 13 pages.
Non-final Office Action, U.S. Appl. No. 14/237,100, mailed Sep. 30, 2015, 21 pages.
Markoff, "Data Centers' Power Use Less Than Was Expected", The New York Times, Jul. 31, 2011, 3 pages.
"The Green500 List—Nov. 2013", The Green 500, Nov. 20, 2013, 3 pages. [http://www.green500.org].
Hernandez, "Are Liquid-Cooled Servers Coming to a Data Center Near You?", CleanTech, Dec. 4, 2009, 2 pages.
"Green Revolution Cooling Named a Disruptive Technology of the Year at SC'10", Press Release, Nov. 1, 2010, New Orleans, LA, 1 page.
"Green Revolution Cooling Named Disruptive at SC'09", Press Release, Aug. 3, 2009, Austin, TX, 1 page.
Park, "New Cooling Strategies for Greater Data Center Energy Efficiency", Facebook, Nov. 4, 2010, 4 pages.
"Disruptive Technologies", Super Computing, Nov. 14-20, 2009, 2 pages, Oregon Convention Center, Portland, Oregon.
"Disruptive Technologies", Super Computing, Nov. 13-19, 2010, 5 pages, New Orleans, LA.
Hernandez, "Will IT Managers Warm to Liquid-Cooled Servers?", Dec. 8, 2009, 3 pages.

* cited by examiner

SYSTEM AND METHOD OF PACKAGING COMPUTING RESOURCES FOR SPACE AND FIRE-RESISTANCE

PRIORITY CLAIM

This application claims the benefit of U.S. Provisional Application Ser. No. 61/854,949 entitled "Methods for packing a carnotJet pump module for space and or fire resistance" filed May 6, 2013, which is incorporated herein by reference in its entirety.

BACKGROUND

1. Field

The present invention relates generally to providing resources for computing. More particularly, the present disclosure relates to systems and methods for packaging computing and associated components for space efficiency and/or fire resistance.

2. Description of the Related Art

A data center typically includes a group of computing devices at a common physical location. Data centers are often housed in conventional building structures and use air conditioning systems to remove heat generated by electronic components (chips, hard drives, cards, etc.)

Many commercially-available servers used in data centers are designed for air cooling. Such servers usually comprise one or more printed circuit boards having a plurality of electrically coupled devices mounted thereto. These printed circuit boards are commonly housed in an enclosure having vents that allow external air to flow into the enclosure, as well as out of the enclosure after being routed through the enclosure for cooling purposes. In many instances, one or more fans are located within the enclosure to facilitate this airflow.

Data centers housing such servers and racks of servers typically distribute air among the servers using a centralized fan (or blower). As more fully described below, air within the data center usually passes through a heat exchanger for cooling the air (e.g., an evaporator of a vapor-compression cycle refrigeration cooling system (or "vapor-cycle" refrigeration), or a chilled water coil) before entering a server. In some data centers, the heat exchanger has been mounted to the rack to provide "rack-level" cooling of air before the air enters a server. In other data centers, the air is cooled before entering the data center.

In general, electronic components of higher performing servers dissipate correspondingly more power. However, power dissipation for each of the various hardware components (e.g., chips, hard drives, cards) within a server can be constrained by the power being dissipated by adjacent heating generating components, the airflow speed and airflow path through the server and the packaging of each respective component, as well as a maximum allowable operating temperature of the respective component and a temperature of the cooling air entering the server as from a data center housing the server. The temperature of an air stream entering the server from the data center, in turn, can be influenced by the power dissipation and proximity of adjacent servers, the airflow speed and the airflow path through a region surrounding the server, as well as the temperature of the air entering the data center (or, conversely, the rate at which heat is being extracted from the air within the data center).

It requires a substantial amount of space to house data centers in conventional buildings. In addition, servers deployed in buildings may not portable and may be expensive, as energy costs and power dissipation continue to increase. Air cooling of a data center is also space intensive, because the efficiency of cooling is affected by the proximity of electronic components.

Electrical or other ignition sources sometimes cause fires in data centers. Data center fires can be quite costly events, since a fire can easily and quickly spread to damage numerous pieces of expensive equipment packed into a small area. The oils used to cool servers will catch fire under certain conditions. In some cases, a fire can spread not only in oil in tanks holding rack-mounted servers, but also to oil spilled in around the racks during installation or maintenance.

SUMMARY

Embodiments of systems and methods of packaging and operating computing resources are described herein. In an embodiment, a computing system includes one or more rack rows comprising one or more racks. The racks includes one or more tanks that hold liquid coolant for at least one of the one or more servers, and a liquid coolant to remove heat from at least one of the one or more servers. An aisle may be provided next to a rack row or between two of the rack rows. The aisle may include a floor. The floor can be walked on by service personnel to access at least one of the one or more racks in at least one of the rows. Cooling components at least partially below the aisle move a liquid to remove heat from at least one of the servers in at least one of the racks.

In an embodiment, a method of packaging and providing an operating environment for computing resources includes: providing one or more rack rows including one or more racks, wherein at least one of the racks includes one or more servers; at least partially filling at least some of the racks with liquid coolant; and providing one or more cooling components at least partially below the racks, wherein at least one of the cooling components moves a liquid to remove heat from at least one of the servers in at least one of the racks.

In an embodiment, a cooling module includes one or more pumps and an enclosure. The pumps move at least one liquid to remove heat from liquid coolant in at least one rack. The top of the enclosure is coolant-permeable such that liquid coolant can pass through the top into the enclosure. The cooling module top is configured to serve as a floor for service personnel standing on the top of the enclosure to access servers in the racks.

In an embodiment, a data center includes one or more racks, a floor, and a cooling component. The cooling component is under the floor. The cooling component moves a liquid to remove heat from at least one of the servers in at least one of the racks. The floor supports service personnel while the service personnel access racks. The floor includes a coolant-permeable and fire-suppressing material, such as pervious concrete.

In an embodiment, a computing module includes one or more racks including servers and one or more tanks configured to hold liquid coolant for the servers. Liquid coolant held the tanks removes heat from the servers. A cooling component moves the liquid coolant in the tanks such that a least a portion of the liquid circulates within the tank. A portion of the circulating fluid passes through or across at least one of the servers to remove heat from the at least one of the servers. The liquid coolant circulates such that substantially all of the liquid coolant on the surface of the liquid coolant contained in the at least one tank is in motion when the cooling component is operating.

In an embodiment, a computing system includes one or more rack rows comprising two or more racks. A cable tray spans across two or more of the racks in at least one of the rack rows.

Figure 1A:
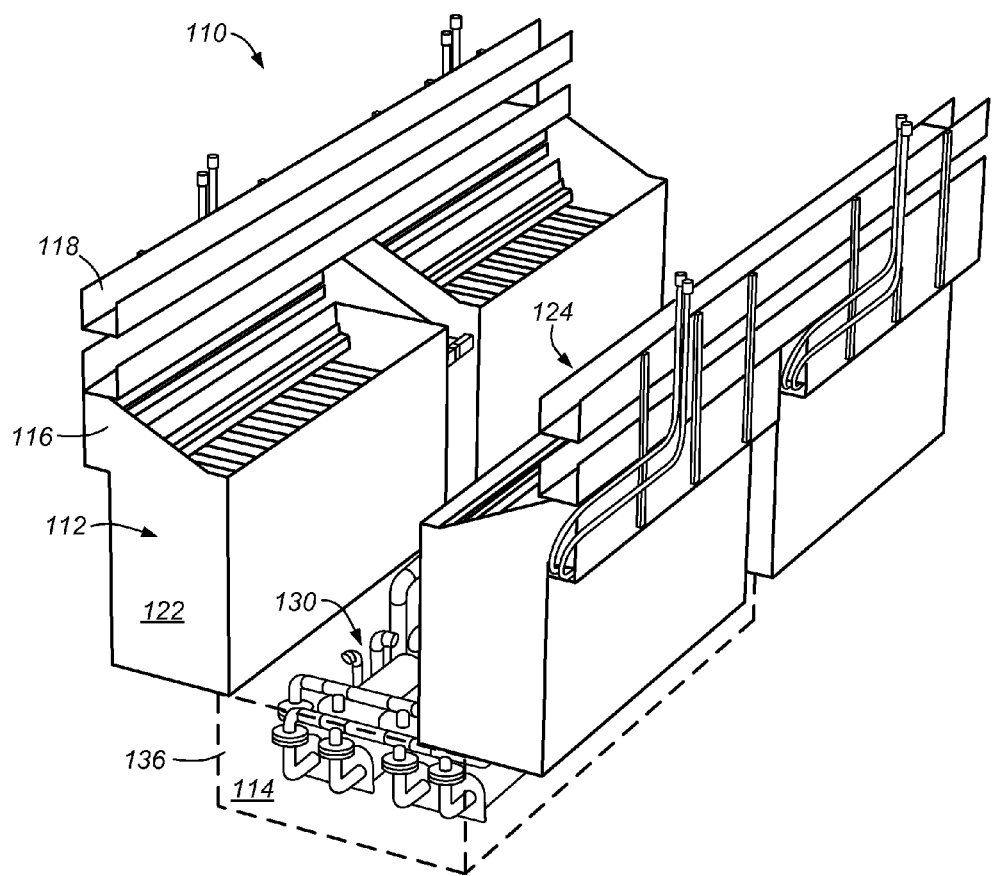
FIG. 1A illustrates an embodiment of computing system including enclosed cooling module for maintaining racks under the floor of an aisle between the racks.

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In some embodiments, a method for integrating a computing system includes positioning a pump module for a set of liquid cooled racks such that the pump module fits under a floor. The racks and the pump module may include provisions to reduce the flammability of the unit. In one embodiment, the pipes in between the rack and the pump module are made of steel or another temperature-resistant material such that if a fire breaks out, the oil carrying pipes will not melt or catch fire, and will contain the fluid. The outside of the pump module may be made of steel. In some embodiments, a cooling module circulates liquid coolant in racks in a manner that inhibits and suppresses fire in the racks.

In some embodiments, an enclosure for a pump module includes gaskets to seal the components of the pump module in a closed volume. Sealing a pump module may suppress fire in the pump module (for example, limiting the supply of air in the enclosure.)

In various embodiments, a plurality of servers is mounted vertically in a rack. The servers may be vertically removed and replaced from a rack with an open top. The servers may be mounted in an array, arranged horizontally. Each server may be removed without affecting the functionality of other servers in the rack or in the data center. Each server may operate independently of each of the servers.

In some embodiments, spacing and structure allow for accommodation of many different form factors, including but not limited to conventional rack mount servers normally used for air cooling. Servers may be mounted adjacently to each other to minimize upward flow around the servers or motherboards.

In some embodiments, dielectric fluid is pumped out of a rack, cooled by flowing through a heat exchanger, and pumped back into the rack. In other embodiments, the heat exchanger is located inside the rack. A secondary liquid circuit flows into the rack with dielectric fluid, and through a heat exchanger, cooling the dielectric fluid.

In one embodiment, a dielectric coolant flows out of a rack at an elevated temperature. A circuit may include a pump, heat exchanger, and measurement devices. A secondary circuit flows through the above heat exchanger, cooling the dielectric fluid, then flows outside and dissipates heat external to the room housing the dielectric-filled rack.

Systems and methods of cooling and operating electronic devices using liquid coolant-filled racks may be as described in US Patent Publication No. 2011/0132579 (the "'579 Publication"), by Best et al., published Jun. 9, 2011, which is incorporated by reference in its entirety as if fully set forth herein.

Computing System with Under-Floor Cooling Module and Fire Resistance

In some embodiments, a computing system includes a row of liquid-cooled racks on either side of an aisle. A cooling module is included under a floor of the aisle.

FIG. 1A illustrates one embodiment of a computing system with an under-floor cooling module between two rows of racks. Computing system 110 includes racks 112. A cooling system 114 is provided for each rack. Each of racks 112 is supplied power through a power distribution unit 116. Cable trays 118 hold cables that supply power or enable exchange of data between servers in racks 112 and external systems.

Each of racks 112 includes tank 122. In the embodiment shown in FIG. 1A, a plurality of tanks 122 are provided, each tank 122 containing vertically mounted, independently removable and replaceable data processing modules. As shown in FIG. 1A, in this embodiment, tanks 122 are arranged in two banks adjacent an aisle 124. The tanks may be arranged in other configurations, however. For example, a single bank of tanks 122 may be installed in the center of the unit with aisles on either side of tanks 122. Or a single bank of tanks 122 may be installed against a wall of an enclosure (e.g., a shipping container housing racks and the cooling module.)

Cooling system 114 includes pumps 130, one or more heat exchangers, and associated pipes and control systems. Pumps 130 and the heat exchanger(s) are included in the form of pump module 135. Pump module 135 includes enclosure 136. Enclosure 136 houses the pumps and other components of pump module 135.

The pipes in between the rack and the pump module may be made of steel or another temperature resistance material such that if a fire breaks out, the oil carrying pipes will not melt and will contain the fluid. In addition, the enclosure for the pump module and the rack housing may be made of a fire-retardant material, such as steel.

In some embodiments, the floor of aisle 124 (which, in the embodiment shown in FIG. 1, is the top of the enclosure for the cooling module) is permeable such that coolant (for example, oil) can drip through the floor into the cooling module. Allowing coolant on the floor to seep into a porous material may extinguish or suppress fire (for example, by isolating the oil in the pores of the material from air).

The top of a pump module and any removable service panels for a pump module may be made of flame resistant material. The top of the pump module may have a permeable surface such that any coolant (for example, oil) that has spilled into the aisle drains drips through the top and passes into pump module. In certain embodiments, the system includes one or more trays or pans that collect spilled fluid around the rack or pump module and drain it into the pump module.

Figure 1B:
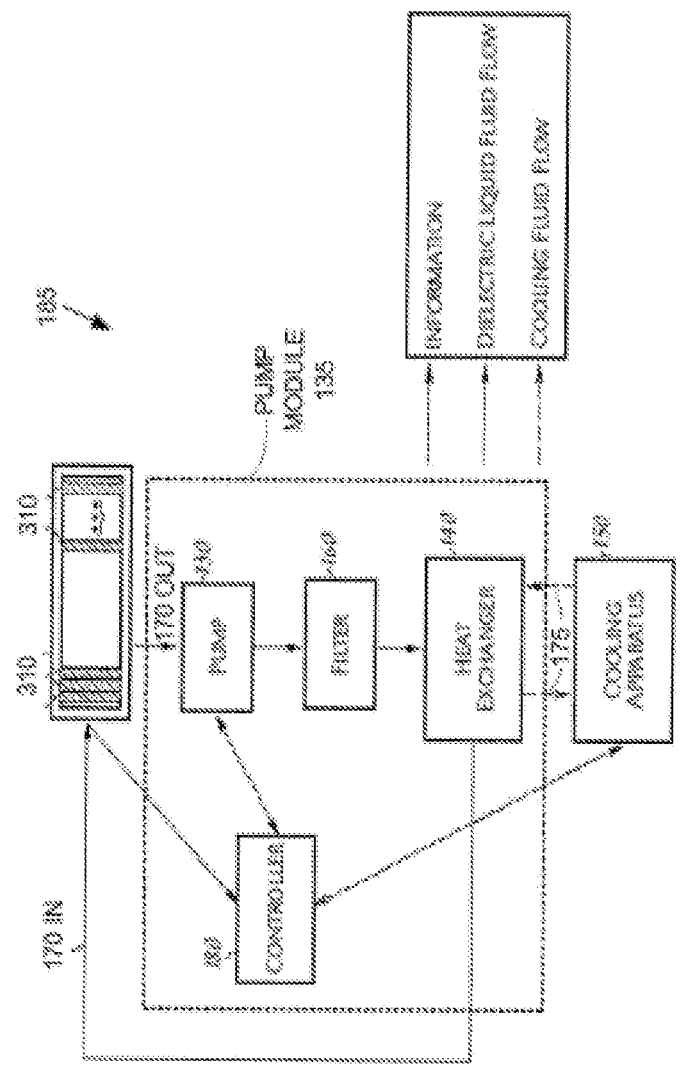
FIG. 1B illustrates one embodiment of an exemplary system for efficiently cooling a plurality of independently operable data processing modules.

As shown in FIGS. 1A and 1B, module 135, which may include at least elements as shown in FIG. 1B, for example, provided cooling for tanks 122, according to one or more embodiments. That is, according to one or more embodiments, each pump module 135 may include primary and secondary pumps 130 (and associated pump motors) connected to filter 160 and liquid coolant heat exchanger 140 of at least one bank of tanks 122 via fluid circuit 170 such that primary and secondary pumps 130 may function independently of one another for backup purposes, with electrically isolated pump 130 motors. According to one or more embodiments, primary pump 130 motor is controlled by variable speed controller 180 for regulating temperature of coolant loop 170 by varying liquid coolant flow, whereas secondary pump motors may be fixed-speed and controlled by on-off control.

Module 135 for evaporative cooling apparatus 150, according to one or more embodiments, includes a controller for controlling a pump motor in loop 175, which may be on-off control or variable speed control, according to one or more embodiments, and includes a controller for one or more fans, motor, which may be like controller 180 of FIG. 1B, for example, but for regulating fans speed of evaporative cooling apparatus 150 in order to control temperature of cooling loop 175 by varying air flow over evaporative final heat exchanger 152. A pump, motor controller and cooling water loop may also be provided to run water over the exterior of a heat exchanger external to module 135 for additional cooling.

Controllers 180 may be interfaced via a network with a master controller for which a single dashboard is provided, according to one or more embodiments, which is for displaying and controlling water flow in one or more loops through one or more cooling towers, fan power for air flow across the one or more heat exchangers, one or more cooling towers, and liquid coolant flow in one or more loops for tanks 122. Preferably, a master controller optimizes all elements for minimum power consumption of the system while maintaining sufficient cooling. The network controller performs diagnostic testing of each element separately for functionality and reports the functionality back to a single user. This single management point makes the system more reliable and more efficient, since the master controller can obtain maximum efficiency for all components. In some embodiments, control is carried out as described in the '579 Publication.

A control module may connect into a larger monitoring system, such as a building management system, data center management system, stand alone or other manner of operations. In some embodiments, the control module controls and monitors external components, such as building water pumps, cooling towers, remote battery backup components, other modules, remote power generators, security, room PDUs, rack PDUs, and other systems.

Power distribution units 116 mount near the back of the racks 112, under the lid area. In this embodiment, the only in/out cable in the rack may be the main power feed(s) for the PDU. This arrangement may minimize the amount of space necessary for users to service the back of the rack.

A single or multiple power feed(s) may feed electronic systems in the module. The power feed may be at voltages such as 208, 240, 277, 480 VAC, or DC voltages in the case of systems using DC battery backup or distribution system. A single feed may go into a power distribution center, or multiple power distribution centers or subpanels, to connect all required loads and/or if redundancy is required.

The power distribution system may include a transformer that adjusts (and, if required, isolates) the input AC voltage to the required load voltages. The power may be distributed into multiple ports. Each or a group may include a breaker. Each port may connect, for example, to a rack-level power rack distribution device (e.g. outlet strip) attached to the racks and/or the liquid-filled rack system. Alternatively, loads may be wired into the distribution system directly or other manner of connection. In some embodiments, power distribution components may adjust DC power from a distribution voltage to a load voltage.

Referring now to FIG. 1B, computing system 110 may include a cooling system 185 for transferring heat from data processing modules 310. The liquid coolant heated by data processing modules 310 is fluidly coupled through suitable piping or lines to a pump 130, which pumps the heated liquid coolant through suitable piping or lines to a heat exchanger 140 associated with a heat-rejection or cooling apparatus 150. In some embodiments, heat exchanger 140 is remotely or distally located from tank 122 and/or computing system 110. Heat exchanger 140 rejects the heat from the incoming heated liquid coolant and fluidly couples the cooled liquid coolant through a return fluid line or piping 170 back into the tank 122. Thus, at least a portion of the liquid coolant completes a fluid circuit through the data processing modules 310 in tank 122, pump 130, heat exchanger 140, and back into tank 122. The heat rejected from the heated liquid coolant through the heat exchanger 140 may then be selectively used by alternative heat rejection or cooling apparatus 150 to dissipate, recover, or beneficially use the rejected heat depending on the different environmental conditions or data processing modules 310 operating conditions to which the system is subject.

Figure 1C:
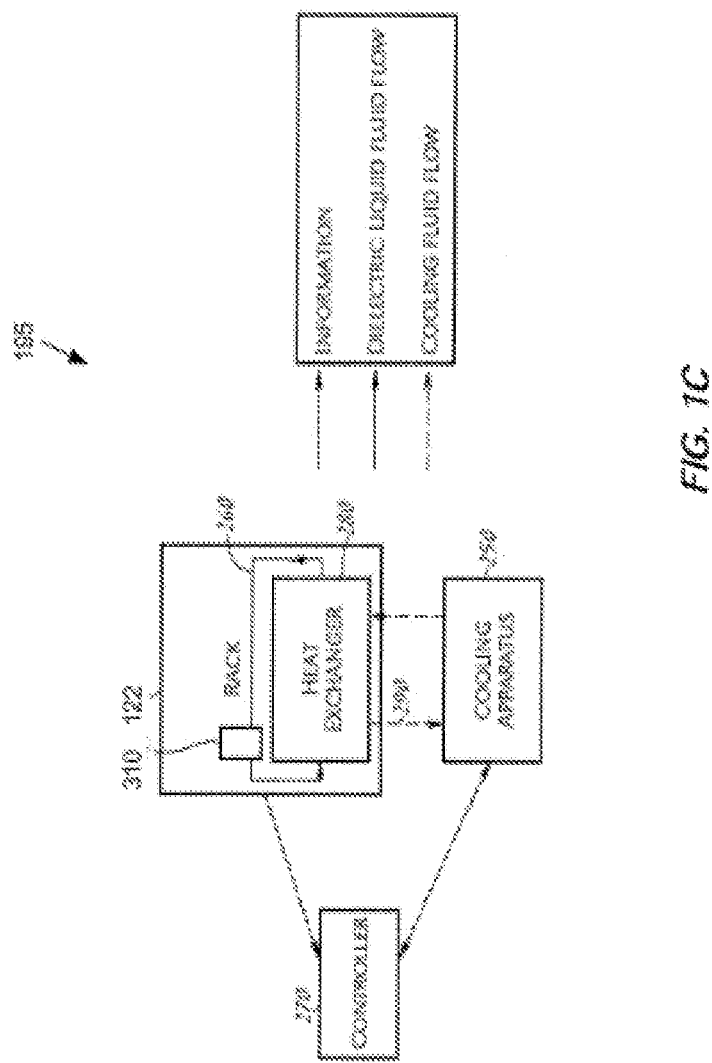
FIG. 1C illustrates an alternative embodiment of an exemplary system for efficiently cooling a plurality of independently operable data processing modules.

Referring now to FIG. 1C, an embodiment of an alternative cooling system 195 is illustrated for cooling data processing modules 310. Unlike the cooling system 185, heated liquid coolant does not flow outside the tank 122. Instead, one fluid circuit 260 of the flowing liquid coolant is completely internal to the tank 122. A thermal coupling device 280, such as a heat exchanger, is mounted within the tank 122 within the fluid circuit through the data processing modules 310, so that at least a portion of the heated liquid coolant flow exiting the data processing modules flows through the thermal coupling device 280. Cooled liquid coolant exits the coupling device 280 and at least a portion of the cooled dielectric coolant circulates in the internal fluid circuit 260 back through the data processing modules 310.

Cooling systems 185 (FIG. 1B) and 195 (FIG. 1C) include a computer controller 180 with suitable applications software for implementing various embodiments. A detailed description of controller 180 is included in international published patent application WO 2010019517 which is incorporated by reference as if fully set forth herein. In some embodiments, temperatures of operation may be established and maintained as set forth in the WO 2010019517 application.

Referring now to FIG. 1B, cooling apparatus 150, which may provides an evaporative final heat exchanger and a motor driven fan for forcing air flow through the final heat exchanger, is located sufficiently far away from tanks 122 to enable adequate heat dissipation at the heat exchanger to cool the heated liquid in loop 175. The resulting heat may be vented to the ambient outside environment. Alternately, the resulting heat may be beneficially used, as described in PCT patent application WO 2013022805. The cooled liquid is then recirculated through the return pipe in loop 175 to cool the liquid coolant in loop 170 which, in turn, cools the data processing modules 310 in tanks 122. In some embodiments, cooling apparatus 150 is mounted on the exterior top of a container for the computing system.

Although one cooling apparatus 150 is shown, more than one may be provided in various embodiments. For example, one cooling apparatus 150 may be provided for each bank of tanks 122. Further, cooling loops (for example, cooling loop 175) may be arranged, and each cooling apparatus 150 may be sized, so that a plurality of cooling apparatus 150 may provide backup cooling for one other. Cooling apparatus 150 need not be attached to the shipping container.

In some embodiments, two or more racks are mounted next to each other, and cable trays extend across two or more racks. The individual racks and cable tray may combine to form one rack. For example, as shown in FIG. 1A, cable tray 118 may extend across two of racks 112.

Figure 1D:
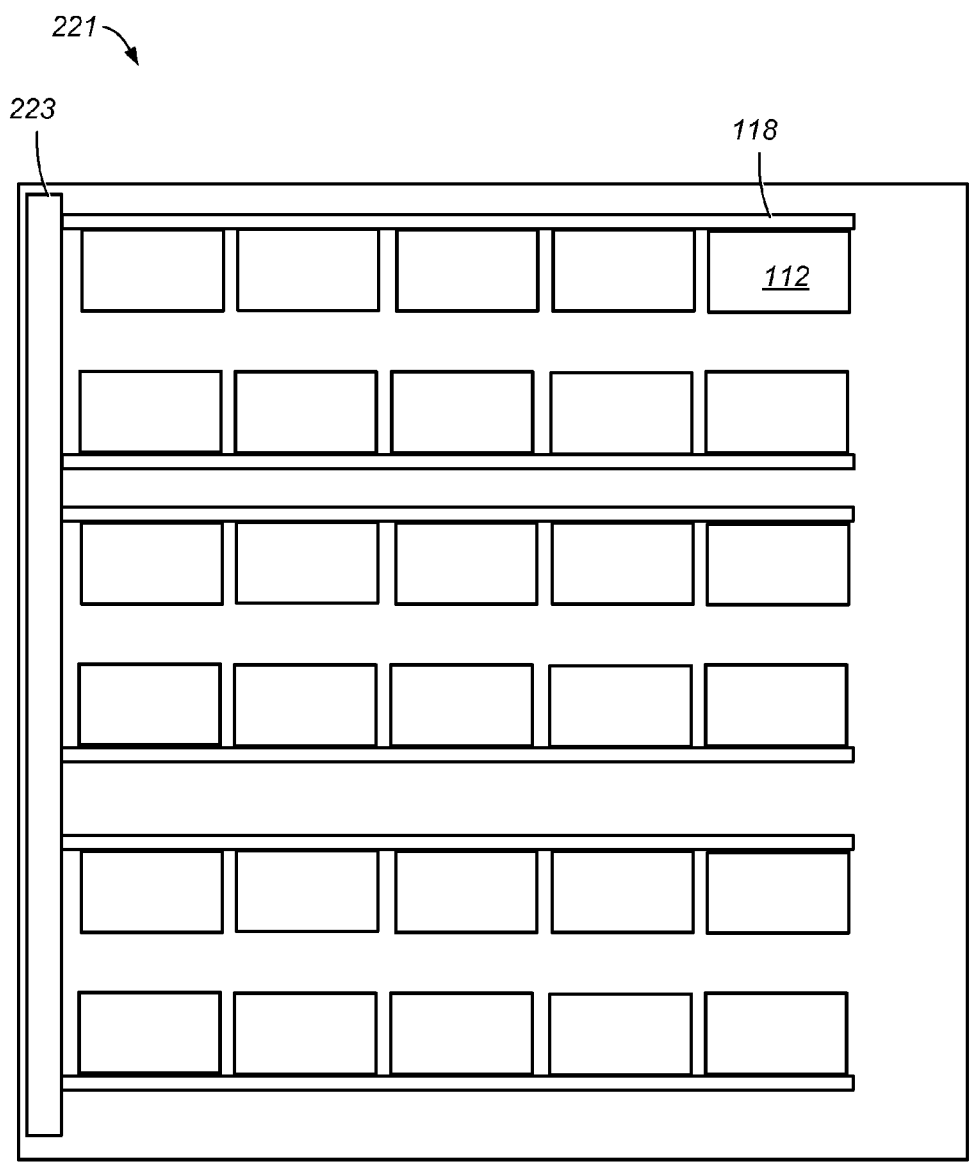
FIG. 1D illustrates a schematic plan view of one embodiment of a data center including cable trays extending across rows of racks.

In certain embodiments, cable trays hold cables that run from one end of the data center to the other (as opposed, for example, to the cable trays in the rack that hold cables that run between components in the rack (server to rack mount switch). FIG. 1D illustrates one embodiment of a data center with cable trays extending across a data center. Cable trays 118 in data center 221 span across racks 112 to a common wall including power distribution system 223, which provides power to each of the rows of racks via cables in cable trays 118.

In one embodiment, a single high voltage power feed goes into one or more power distribution units (PDU). A transformer reduces the power from high voltage to a lower voltage (for example, 480 VAC to 208 VAC in the US). The power distribution may include protection against power spike and/or line noise, such as transient voltage surge suppression. The reduced voltage lines (e.g., 208 VAC) may be distributed into multiple different feeds.

Each feed may be connected to a cabinet distribution unit (CDU) at the rack. Each feed may include a breaker and/or current monitoring. In certain embodiments, one or more of these components are separated out (transformer, transient voltage surge suppression ("TVSS"), and others), rather than housed inside of a power distribution unit.

In some embodiments, CDUs are included and mounted to each rack. The CDUs may be passive, active, or combination thereof. An active CDU may include power level measurement of voltage and current for each plug (normally where the server plugs into) and the capability to turn each port on or off. Monitoring may be performed by control system for the module. Monitoring may include values for CDU, PDU, or both.

Figure 2:
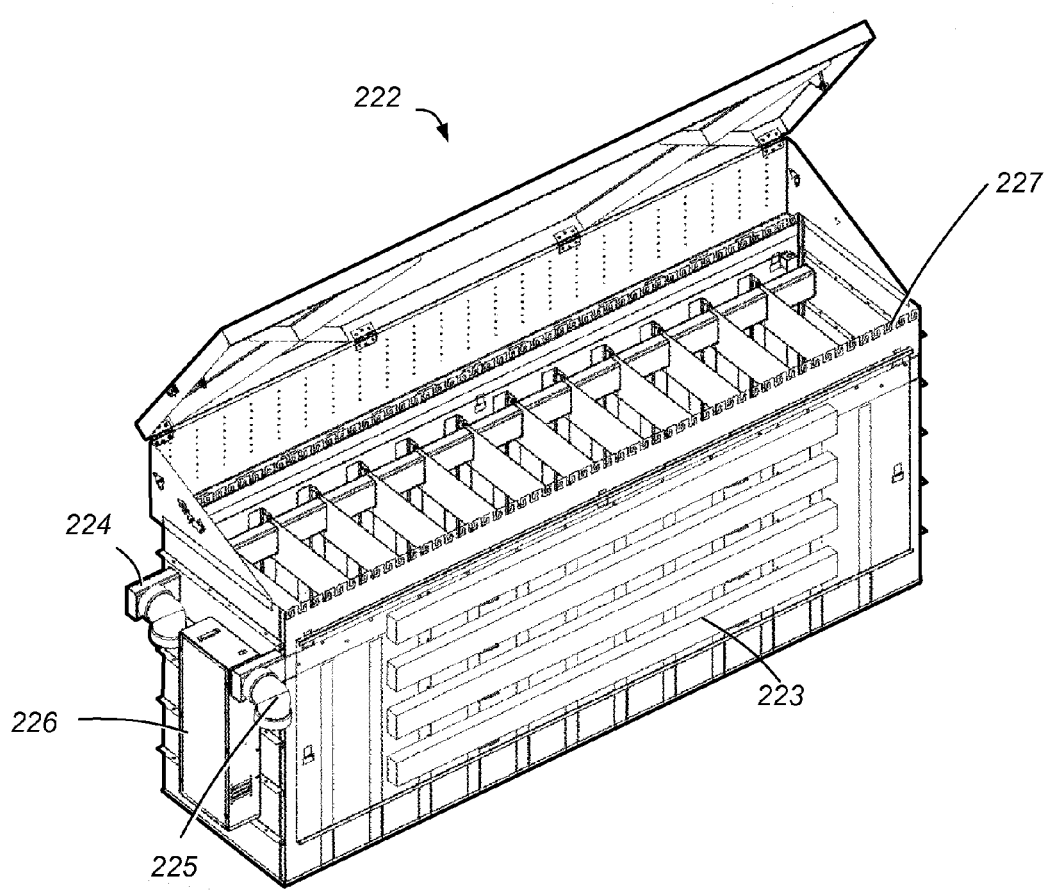
FIG. 2 illustrates a rack that can be used in a computing module in various embodiments.

FIG. 2 illustrates a rack that can be used in a computing module in various embodiments. Rack 222 includes power distribution units 223, liquid coolant inlet port 224, liquid coolant exit port 225, and rack control module 226.

Rack 222 includes a cable management system. Cable management system includes cable management rails 227. Each of cable management rails 227 includes a series of cable guides. The cable guides may be used to guide and support power cables or data cables for each of the servers in rack 232. In some embodiments, cables and cable connector receptacles remain above the surface level of the coolant in the rack.

Figure 3:
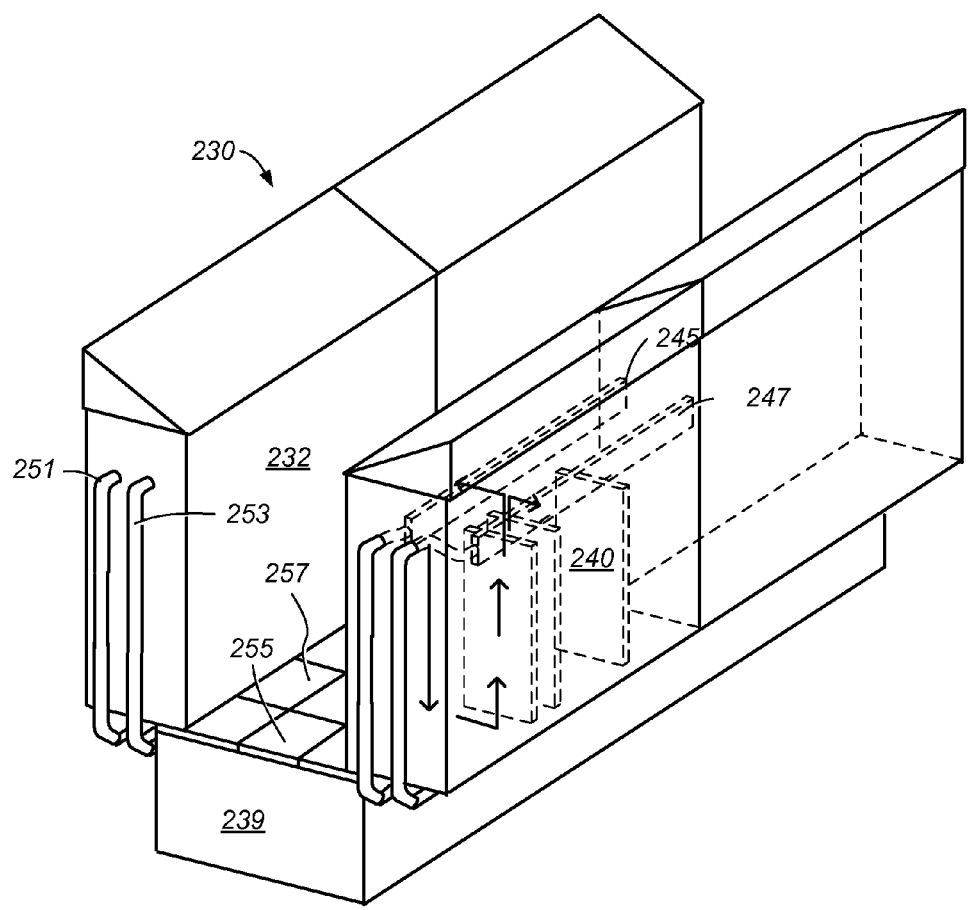
FIG. 3 illustrates one embodiment of a computing module including racks with liquid-cooled servers, power distribution components, and an under-floor cooling module.

FIG. 3 illustrates one embodiment of a computing module including racks with liquid-cooled servers, power distribution components, and an under-floor cooling module. In some embodiments, liquid-cooled servers, power distribution components, and liquid cooling components may ship together as an assembly. Power distribution components and liquid cooling components may be sized for the servers to be operated in the computing module.

Computing module 230 includes racks 232, cooling component 239, and power distribution components (power distribution components may be under the floor of the aisle). Each of racks 232 includes servers 240. Servers 240 are vertically arranged in racks 232. In some embodiments, any of servers 240 may be removed from rack 232 without removing or disturbing operation of the other servers when the top is removed or folded back. Power distribution units may feed power to cabinet power distribution units on each of racks 232.

A computing module of several liquid submersion cooling racks and one pump module (such as computing module 230) may maximize efficiency and data center floor space. Each block of four racks may have its own control system that optimizes coolant flow in real-time for the given heat load while monitoring the cooling system across more than twenty-five parameters.

In some embodiments, OEM and ODM servers are installed vertically into rack 232. Racks 232 may support servers from any manufacturer, in, for example, Standard 19" or Open Compute Standard form factors. Servers may be lowered vertically into the liquid-filled rack. PDUs may be mounted to the front or the back of the rack.

Cooling component 239 may include coolant pumps, filters, and coolant-to-water heat exchangers. The pump module is responsible for circulating the liquid coolant and drawing heated coolant through heat exchangers to remove server heat from the racks. The pump module may then filter the coolant and return the reduced temperature coolant to the liquid submersion cooling rack. The pump module may establish a stable and uniform cooling environment for servers 240 that is controlled to ±1° C. throughout each of racks 232.

Cooling component 239 may receive power connectivity and water connectivity from the facility. Cooling component 239 may be configured to use virtually any form of water available in a data center facility. In some embodiments, a pump module includes an independent secondary system for backup. If the primary pump should fail, the secondary kicks on instantaneously and cooling will continue undisturbed. Although pump module 239 is shown for illustrative purposes at the end of rows of racks 232, depending on the space requirements of the facility, the pump module may be installed adjacent to the racks, under the floor, or in the data center periphery.

Coolant may flow in and out of racks 232 at the ends of racks 232 (coolant lines for the rearmost pair of racks may also be coupled to cooling component 239, however, they are omitted from FIG. 3 for clarity.) In one embodiment, the overall path of coolant flow is as shown in FIG. 3. Coolant coming into rack 232 may be distributed across the length of rack 232 in high pressure manifold 245 and then channeled downward (for example, via ducts, barriers, or baffles) to the bottom of rack 232. In some embodiments, high pressure manifold 245 includes a series of nozzles pointing downwardly in the rack. The nozzles may cause circulation through or across each of servers 240.

Nozzles may be spaced across the length of manifolds 245 and 247, such that a similar circulation is achieved across the length of the manifold (for example, the flow at each server position may be similar). In certain embodiments, a nozzle is provided corresponding to each server location. Nozzles may nevertheless, be spaced at any interval, regular or irregular, to achieve desired flow characteristics (e.g., closer together or farther apart than one nozzle per rack position).

From the bottom of rack 232, coolant may flow up between or through servers 240 until it reaches the top of servers 240 (and near the surface of liquid coolant), increasing in temperature as heat is transferred from heat producing components on the servers. Some of the coolant may be drawn back toward the high-pressure manifold side of the rack. A portion of the coolant near the surface may be drawn out of rack 232 through suction manifold 247 and returned to a heat exchanger in cooling component 239.

Figure 4:
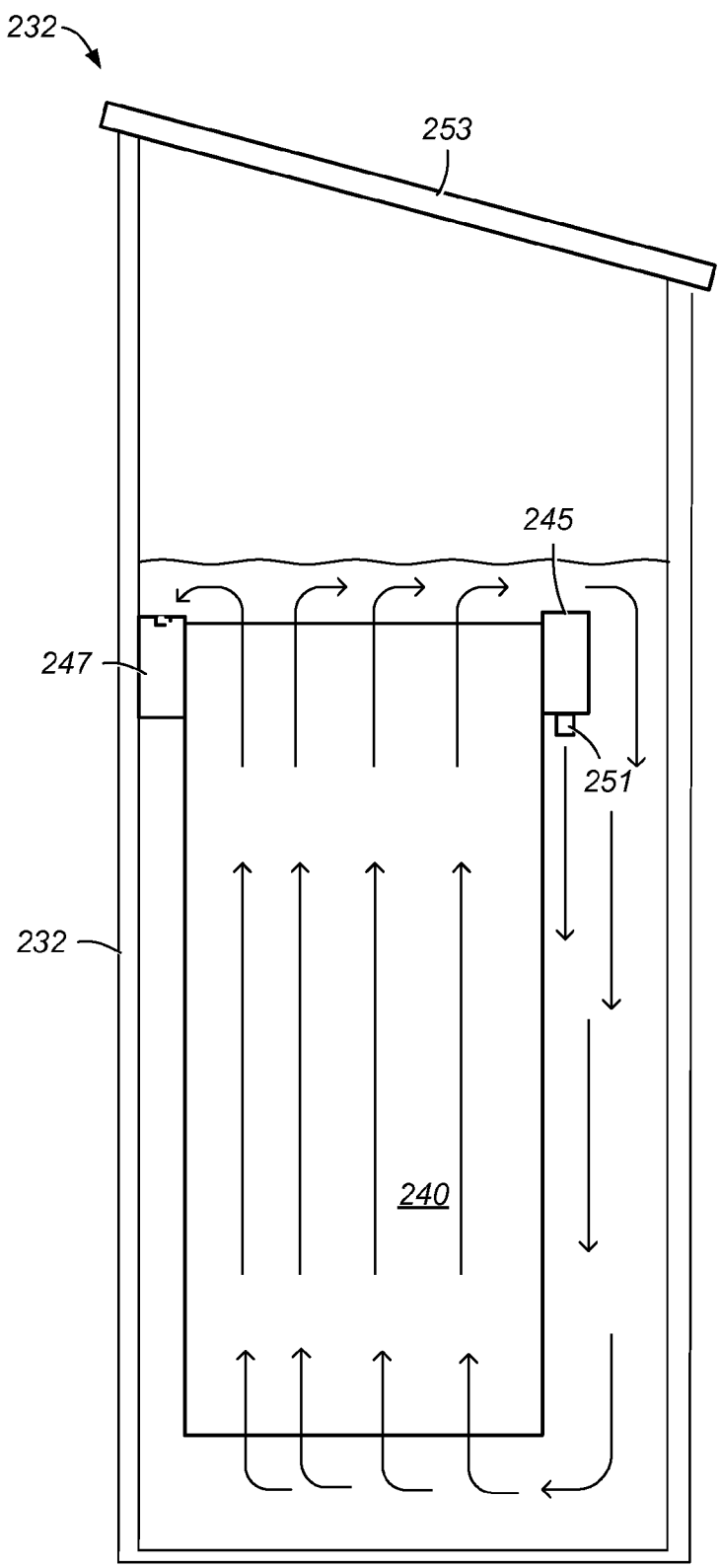
FIG. 4 is a schematic view illustrating circulation at a section of a rack in one embodiment.

Downward flow exiting the nozzles under the manifold may draw liquid at the surface of the bath downward (for example, in the direction of arrows shown in FIG. 4). In some embodiments, suction at the surface of the liquid resulting from the high pressure nozzles is such that the level of liquid on the high pressure manifold side is lower than the level of the liquid on the suction side.

In various embodiments, augmentation devices (such as nozzles, pumps, or fans) are provided at multiple locations in a rack. For example, in certain embodiments, nozzles or pumps may be provided at the bottom of each of servers 232.

In some embodiments, a controller provides diagnostics and controls for computing module 230. The control system optimizes coolant flow to provide the most efficient coolant flow at all times for the given heat load. The control module may also initialize the backup system and provide alerts in the event of system downtown or failure. In various embodiments, the controller may provide temperature analysis, pressure and coolant level verification, power consumption, smart monitoring, and diagnostics. Controller outputs may include log files of the above parameters, e-mail and SMNP diagnostic alerts, and hourly status condition updates. This information may also be made available via a network as well as a secure internet portal.

Coolant Flow Pattern for Fire-Resistance

In some embodiments, a flow pattern in the rack is such that the fluid flow goes from one side of the top of the rack to other (horizontally). This flow may be formed by fluid rising through the server, coming out of the server, travelling horizontally, and then traveling back downward outside of the server. If the top of the rack catches fire, cooled oil constantly rises to the top. This fluid motion may ensure the hot fluid and cold fluid does not separate in the event of a fire.

Because the oil may have a flash point (150 C) much higher than operating temperature of the rack (for example, 40 C), the cold fluid (40 C) may cool the fluid on fire (>150 C). The cooling may reduce energy of the fire or reduce the surface temperature of the oil below the flash point, extinguishing the fire.

FIG. 4 is a schematic view illustrating circulation at a section of a rack in one embodiment. The pattern in FIG. 4 may be the same at each server position in the rack. Liquid coolant is introduced under pressure through nozzle 251 on the underside of high-pressure manifold 245. High pressure manifold 245 causes circulation of part of the coolant in a generally down-across-up-across pattern within the bath of liquid coolant. The arrows in FIG. 4 illustrate the general pattern of the flow.

Coolant from nozzle 251 may combine with coolant being drawn from the surface of the coolant and moved near the bottom of the tank, below the bottom of servers 240. Coolant in the bottom of the tank may be forced upwardly through or across servers 240, removing heat from heat-producing components (for example, processors, semiconductor devices) of the servers. Similar to the manner described relative to FIG. 3, near the surface of the coolant, some of the coolant may be drawn back toward the high-pressure manifold side of the rack. A portion of the coolant near the surface may be drawn out of rack 232 through suction manifold 247 and returned to a heat exchanger in cooling component 239.

Suction manifold is located against the wall of rack 232. All of the coolant at the surface is thus in a contiguous body between suction manifold 247 and the opposing wall of the rack. In some embodiments, the cooling system moves the liquid coolant such that substantially all of the liquid coolant at the surface is in motion (for example, either right toward the wall on the high-pressure manifold side or left toward the wall on the suction manifold side.) In this manner, the amount of stationary liquid at the surface of the bath may be eliminated or minimized. Motion of the liquid (rather than, for example, stationary fluid) may inhibit fire at the surface of the coolant (e.g. by reducing or minimizing hot spots and/or reducing temperatures below the flash point of the oil). In some embodiments, operation of the cooling system to move the liquid coolant inhibits dead zones at the surface of the coolant in the rack.

Cover 253 of rack 232 may be made of a fire-retardant material, such as steel. In addition, cover 253 may be non-porous such that the lid inhibits air from entering into the interior of the rack from the outside. In some embodiments, the cover is sealed (for example, by way of a gasket between the sides of the rack and the cover. When cover 253 is closed, cover 253 may suffocate any fire that starts in the interior of rack 232.

Figure 5A:
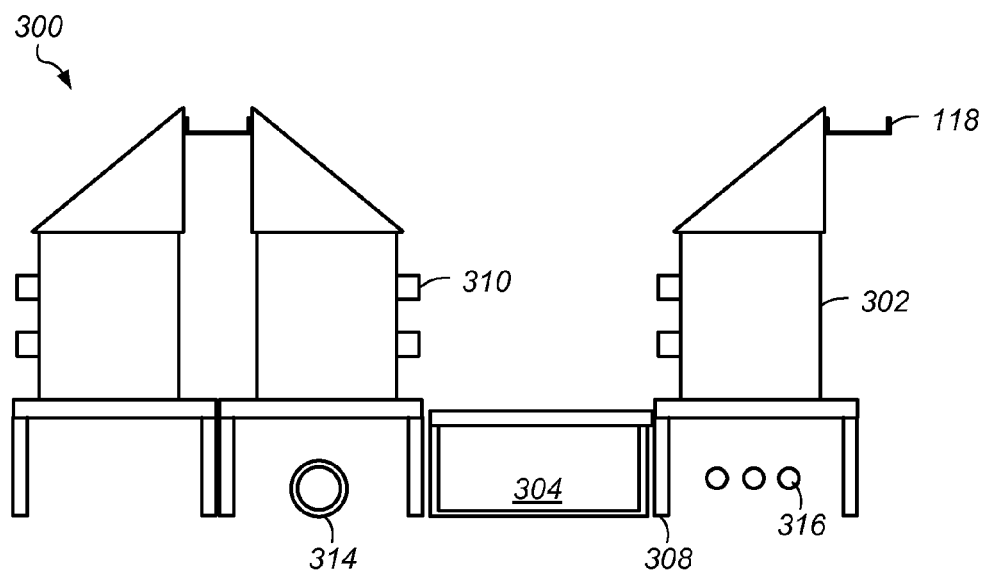
FIG. 5A is a schematic end view illustrating an embodiment of rack in a data center with a pump module in between rack rows.
Figure 5B:
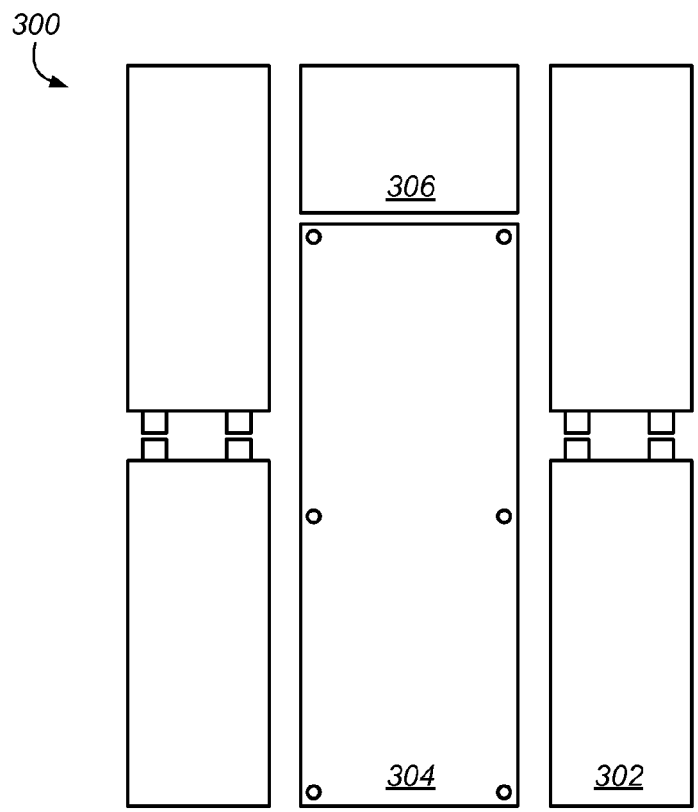
FIG. 5B is a schematic plan view illustrating an embodiment of rack in a data center with a pump module in between rack rows.

FIG. 5A is a schematic end view illustrating an embodiment of rack in a data center with a pump module in between rack rows. FIG. 5B is a schematic plan view illustrating an embodiment of rack in a data center with a pump module in between rack rows. The top of the pump module is designed to be a walking surface with surface tiles that can be removed to service equipment. (Tiles may be for example, may be as shown as in FIG. 3, in which tiles 255 form floor 257). Surface tiles may have a non-slip surface. Pieces of the top of a pump module(s) (for example, tiles such as tiles 255) can be removed to enable service personnel to access the pumps and/or equipment in the pump module that must be serviced. In addition, the top of the pump module may serve as a floor for personnel to access the racks. Stands may position racks at a height relative to floor to enable service personnel standing on the floor to pull servers out of the rack.

Computing system 300 includes racks 302, pump module 304, and electrical distribution module 306. Each of racks 302 is mounted on one of stands 308. The height that the racks are placed at may be selected to enable convenient access of the racks by service personnel standing on the top surface of pump module 306. Racks 302, pump module 304, and electrical distribution module 306 may be similar to those described above relative to FIGS. 1A through 4. Each of racks 302 includes power distribution units ("PDUs") 310. Water pipes 314 and cables 316 may be run under one or more racks 302 via the space provided by stands 308. In some embodiments, stands for supporting a rack are integrated into one or more racks, a pump module, or both.

In the enclosed cooling module, some heating occurs due to the heat produced by components operating in the module, or from the heated coolant. For example, pump/motor systems in a pump module enclosure may produce heat due to inefficiency. The motors may be air cooled and dump heat into the air, which is mostly sealed inside of the pump module. In certain embodiments, a radiator is provided in the enclosure (for example, attached inside of the pump module) with oil or water (the secondary circuit) flowing through the radiator. The radiator transmits heat from ambient air inside the pump module into the oil. The heat generated by the motors is cooled by the radiator.

In some embodiments, a fluid level sensor is provided that monitors if the liquid level gets too high. For example, if coolant accumulates in a pump module enclosure above a pre-determined level, a controller may automatically shut off the pump or other systems, sound an alarm, or activate a drain or a device to pump out the accumulated liquid.

In some embodiments, mounting members of a rack are configured to mount the servers closely adjacent to one another in the server rack to restrict the flow of the dielectric liquid coolant between the vertically-oriented servers, such that the flow of the dielectric liquid coolant through the servers is enhanced In some embodiments, a temperature of a liquid coolant may be monitored and/or controlled. Methods of monitoring and controlling temperature of the oil may be as described in the '579 Publication"), by Best et al., published Jun. 9, 2011, which is incorporated by reference in its entirety as if fully set forth herein.

In some embodiments, flow through the servers in augmented using augmentation, such as nozzles, fans, or pumps. A separate augmentation device may be included on each node, every other node, each row of nodes, or other frequency. The '579 Publication describes apparatus and methods using augmentation devices in various embodiments.

In some embodiments, liquid coolant may be removed through the top of the rack. Liquid coolant may be reintroduced after having been cooled (for example, by passing the liquid coolant through a heat exchanger outside of the rack. The '579 Publication describes apparatus and methods for removing liquid coolant from the top of a rack in various embodiments.

In various embodiments described herein, computing modules are shown as having four racks. Computing modules may nevertheless in various embodiments have any number of racks. In one embodiment, a computing module has one rack.

In various embodiments described herein, a system has been described as holding motherboard assemblies in a submersed or partially submersed condition. A system may nevertheless in various embodiments hold other types of circuit board assemblies or components in a partially submersed condition.

As used herein, the terms "or" is intended to cover a non-exclusive inclusion. That is, "or" includes both meanings of both "or" and "and/or."

The terminology used herein is for the purpose of describing particular embodiments only and is not intended to be limiting of the invention. As used herein, the singular forms "a", "an" and "the" are intended to include the plural forms as well, unless the context clearly indicates otherwise.

As used herein, the term "fire-suppressing" means tending to suppress or extinguish, or tending to inhibit propagation of, a fire. Fire-suppressing elements may be active (e.g., a fire suppression system that sprays fire suppressant material in response to an alarm), passive (e.g., a pervious concrete material that suppresses fire on a surface, or panel configured to suffocate fire in an enclosed volume), or a combination thereof.

As used herein, the term "data processing module" generally refers to one or more computing devices running software configured to receive requests, typically over a network. A data processing module may include one or more servers connected to a network and running software configured to receive requests from other computing devices on the network, which may include other servers, and desktop and mobile computing devices, including cellular phones. Such data processing modules typically include one or more processors, memory, input/output connections to a network and other electronic components, and may include specialized computing devices such as blade servers, network routers, data acquisition equipment, disc drive arrays, and other devices commonly associated with data centers.

As used herein, the term "node" refers to a computing device that can be configured to receive and respond to requests to perform computing operations. A node may have one processor or multiple processors. In some embodiments, a node includes one or more servers and/or one or more data processing modules.

As used herein, the term "tank" refers to a container with or without a lid, containing a liquid coolant into which one or more data processing modules may be installed.

As used herein, an "independently operable" device means capable of usefully functioning without regard to an operational status of an adjacent device. As used herein, an "independently operable data processing module" means a data processing module that is capable of usefully functioning to provide data processing services and without regard to an operational status of an adjacent data processing module. Operation of independently operable data processing modules can be influenced (e.g., heated) by one or more adjacent data processing modules, but as used herein, an independently operable data processing module generally functions regardless of whether an adjacent data processing module operates or is operable.

As used herein, the term "liquid coolant" may be any sufficiently nonconductive liquid such that electrical components (e.g., a motherboard, a memory board, and other electrical or electronic components designed for use in air) continue to reliably function while submerged without significant modification. A suitable liquid coolant is a dielectric liquid coolant, including without limitation vegetable oil, mineral oil, transformer oil, or any liquid coolant have similar features (e.g., a non-flammable, non-toxic liquid with dielectric strength better than or nearly as comparable as air).

As used herein, "fluid" means either a liquid or a gas, and "cooling fluid" means a gas or liquid coolant typically used for heat-rejection or cooling purposes. As used herein, a liquid coolant is a subset of the universe of cooling fluids, but a cooling fluid may be a dielectric or non-dielectric liquid or gas, such as, for example, a conventional air conditioning refrigerant.

The flowchart and block diagrams in the drawings illustrate the architecture, functionality, and operation of possible implementations of systems, methods and program products, according to various embodiments of the present invention.

While this specification contains many specifics, these should not be construed as limitations on the scope of the invention or of what can be claimed, but rather as descriptions of features specific to particular implementations of the invention. Certain features that are described in this specification in the context of separate implementations can also be implemented in combination in a single implementation. Conversely, various features that are described in the context of a single implementation can also be implemented in multiple implementations separately or in any suitable sub combination. Moreover, although features can be described above as acting in certain combinations and even initially claimed as such, one or more features from a claimed combination can in some cases be excised from the combination, and the claimed combination can be directed to a sub combination or variation of a sub combination.

Similarly, the separation of various system components in the implementations described above should not be understood as requiring such separation in all implementations, and it should be understood that the described program components and systems can generally be integrated together in a single software product or packaged into multiple software products.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Methods may be implemented manually, in software, in hardware, or a combination thereof. The order of any method may be changed, and various elements may be added, reordered, combined, omitted, modified, etc. Changes may be made in the elements described herein without departing from the spirit and scope of the invention as described in the following claims.

What is claimed is:

1. A computing system, comprising:
    one or more rack rows comprising one or more racks, wherein at least one of the racks comprises:
    one or more servers;
    one or more tanks configured to hold liquid coolant for at least one of the one or more servers; and
    a liquid coolant held in at least one of the tanks and configured to remove heat from at least one of the one or more servers;
    an aisle next to one of the rack rows or between two of the rack rows, wherein the aisle comprises a floor, wherein the floor can be walked on by service personnel to access at least one of the one or more racks in at least one of the rows, wherein at least a portion of the floor over at least one of the cooling components is pervious concrete; and
    one or more cooling components at least partially below the aisle, wherein at least one of the cooling components is configured to move a liquid to remove heat from at least one of the servers in at least one of the racks.

2. The computing system of claim 1, wherein the floor and the rack enclosures are at least partially made of fire-retardant materials.

3. The computing system of claim 1, wherein at least a portion of the floor over at least one of the cooling components comprises a coolant-permeable and fire suppressing material.

4. The computing system of claim 1, wherein at least one of the one or more cooling components configured to move the liquid coolant in the tank such that a least a portion of the liquid circulates within the tank, wherein at least a portion of the circulating fluid passes through or across at least one of the servers to remove heat from the at least one of the servers,
    wherein the liquid coolant circulates such that substantially all of the liquid coolant on the surface of the liquid coolant contained in the at least one tank is in motion when the cooling component is operating.

5. The computing system of claim 1, wherein the cooling component comprises an enclosure, wherein the enclosure is at least partially made of a fire-retardant material.

6. The computing system of claim 1, wherein at least one of the racks comprises a top cover, wherein the top cover is at least partially made of a fire suppressing material.

7. The computing system of claim 1, wherein the floor forms at least a portion of the top of an enclosure for at least one of the cooling components.

8. The computing system of claim 1, wherein at least a portion of the floor over at least one of the cooling components comprises one or more floor tiles.

9. The computing system of claim 1, wherein at least one of the racks is mounted on a stand to raise the rack relative to the floor of the aisle.

10. A method of packaging and providing an operating environment for computing resources, comprising:
    providing one or more rack rows including one or more racks, wherein at least one of the racks includes one or more servers, the one or more rack rows located on a floor, wherein the floor comprises pervious concrete;
    at least partially filling at least some of the racks with liquid coolant; and
    providing one or more cooling components at least partially below the racks, wherein at least one of the cooling components is configured to move a liquid to remove heat from at least one of the servers in at least one of the racks.

11. The method of claim 10, wherein providing one or more cooling components comprises enclosing one or more cooling components in a fire-resistant enclosure.

12. The method of claim 10, further comprising circulating a coolant in at least one of the racks such that fire is suppressed the at least one rack.

13. The method of claim 10, further comprising collecting coolant on one or more surfaces.

14. A cooling module, comprising:
    one or more pumps configurable to move at least one liquid to remove heat from liquid coolant in at least one rack; and an enclosure, wherein at least one of the pumps is at least partially housed in the enclosure, wherein the enclosure comprises a top, wherein at least a portion of the top is coolant-permeable such that liquid coolant can pass through the top into the enclosure, wherein at least a portion of the cooling module top is configured to serve as a floor for service personnel standing on the portion to access at least one of the racks, wherein at least a portion of the top of the enclosure comprises pervious concrete.

15. The cooling module of claim 14, wherein the floor and the enclosure are at least partially made of fire-retardant materials.

16. The cooling module of claim 14, wherein at least a portion of the top of the enclosure comprises a coolant-permeable and fire-suppressing material.

17. The cooling module of claim 14, wherein at least a portion of the floor top of the enclosure comprises one or more floor tiles.

18. The cooling module of claim 14, wherein the cooling module is configured to at least partially support one or more racks.

* * * * *